(12) United States Patent
Kim et al.

(10) Patent No.: US 9,721,801 B2
(45) Date of Patent: Aug. 1, 2017

(54) APPARATUS AND A METHOD FOR TREATING A SUBSTRATE

(71) Applicant: SAMSUNG ELECTRONICS CO., LTD., Suwon-si, Gyeonggi-do (KR)

(72) Inventors: Hongjin Kim, Seoul (KR); Kyoungseob Kim, Suwon-si (KR); Sungho Shin, Yongin-si (KR); Kuntack Lee, Suwon-si (KR); Kihong Cho, Anyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/972,505

(22) Filed: Dec. 17, 2015

(65) Prior Publication Data

US 2016/0104629 A1   Apr. 14, 2016

Related U.S. Application Data

(62) Division of application No. 13/755,533, filed on Jan. 31, 2013, now abandoned.

(30) Foreign Application Priority Data

Feb. 3, 2012 (KR) .................. 10-2012-0011354

(51) Int. Cl.
*H01L 21/306* (2006.01)
*H01L 21/465* (2006.01)
*H01L 21/02* (2006.01)
*H01L 21/67* (2006.01)
*B24C 1/08* (2006.01)

(52) U.S. Cl.
CPC .......... *H01L 21/30625* (2013.01); *B24C 1/08* (2013.01); *H01L 21/02021* (2013.01); *H01L 21/02057* (2013.01); *H01L 21/465* (2013.01); *H01L 21/67219* (2013.01)

(58) Field of Classification Search
None
See application file for complete search history.

(56) References Cited

U.S. PATENT DOCUMENTS

| 5,191,738 | A | * | 3/1993 | Nakazato | B24B 37/013 451/287 |
| 5,573,633 | A | * | 11/1996 | Gambino | H01L 21/3212 216/38 |
| 5,726,099 | A | * | 3/1998 | Jaso | H01L 21/31053 252/79.1 |
| 5,752,875 | A | * | 5/1998 | Ronay | H01L 21/3212 257/E21.304 |
| 5,885,899 | A | * | 3/1999 | Armacost | H01L 21/3212 252/79.1 |
| 5,961,372 | A | * | 10/1999 | Shendon | B24B 21/10 451/299 |

(Continued)

FOREIGN PATENT DOCUMENTS

| JP | 2011-040674 | 2/2011 |
| KR | 10-2002-0051297 A | 6/2002 |

(Continued)

*Primary Examiner* — Allan Olsen
(74) *Attorney, Agent, or Firm* — F. Chau & Associates, LLC

(57) ABSTRACT

A substrate treating method may include jetting a fluid containing an abrasive onto a substrate, and polishing the substrate using the jetted fluid.

14 Claims, 13 Drawing Sheets

(56) References Cited

U.S. PATENT DOCUMENTS

| | | | |
|---|---|---|---|
| 6,057,245 A * | 5/2000 | Annapragada | B24B 7/228 257/E21.244 |
| 6,165,048 A * | 12/2000 | Russ | B23Q 11/1069 210/108 |
| 6,705,929 B1 | 3/2004 | Nishimoto et al. | |
| 6,950,277 B1 * | 9/2005 | Nguy | G11B 5/11 360/125.14 |
| 7,758,404 B1 * | 7/2010 | Ryder | B24B 9/065 15/102 |
| 8,647,171 B2 * | 2/2014 | Duescher | B24B 37/107 451/11 |
| 2003/0054739 A1 * | 3/2003 | Mizushima | B24B 9/065 451/57 |
| 2003/0136759 A1 * | 7/2003 | Mikolas | G02B 3/0025 216/26 |
| 2003/0151020 A1 * | 8/2003 | Lee | B81C 1/00611 252/2 |
| 2003/0189025 A1 * | 10/2003 | Yu | G02F 1/33 216/24 |
| 2003/0211747 A1 * | 11/2003 | Hegde | C09G 1/02 438/700 |
| 2004/0002207 A1 * | 1/2004 | Yu | H01L 21/76837 438/622 |
| 2004/0003828 A1 * | 1/2004 | Jackson | B08B 7/0021 134/1 |
| 2004/0005769 A1 * | 1/2004 | Mikolas | B24B 37/013 438/612 |
| 2004/0060607 A1 * | 4/2004 | Wheeler | B24B 37/04 137/825 |
| 2004/0188379 A1 * | 9/2004 | Mikolas | G02B 6/125 216/24 |
| 2004/0216388 A1 * | 11/2004 | Mathur | C09G 1/02 51/298 |
| 2004/0266317 A1 * | 12/2004 | Mase | B24C 1/08 451/2 |
| 2005/0064709 A1 * | 3/2005 | Shimomura | B24B 37/24 438/689 |
| 2005/0098195 A1 * | 5/2005 | Jackson | B08B 3/02 134/6 |
| 2005/0142815 A1 * | 6/2005 | Miyazaki | H01L 21/02238 438/464 |
| 2006/0057943 A1 * | 3/2006 | Venigalla | C09G 1/02 451/41 |
| 2006/0191871 A1 | 8/2006 | Chen et al. | |
| 2006/0243304 A1 * | 11/2006 | Hsu | B08B 1/04 134/6 |
| 2007/0060024 A1 | 3/2007 | Shirasu et al. | |
| 2007/0238393 A1 | 10/2007 | Shin et al. | |
| 2007/0293047 A1 | 12/2007 | Fukushima et al. | |
| 2009/0101625 A1 * | 4/2009 | Bakshi | B82Y 30/00 216/38 |
| 2009/0114421 A1 * | 5/2009 | Swift | G01R 1/06755 174/128.1 |
| 2009/0255558 A1 | 10/2009 | Inukai et al. | |
| 2010/0130101 A1 | 5/2010 | Wang et al. | |
| 2010/0171055 A1 * | 7/2010 | Dourdeville | B23K 20/023 251/129.11 |
| 2011/0177623 A1 * | 7/2011 | Benner | B24B 57/02 438/5 |
| 2011/0318994 A1 * | 12/2011 | Darcangelo | B24B 1/005 451/41 |
| 2012/0115399 A1 * | 5/2012 | Yoshizawa | B24C 1/04 451/38 |
| 2013/0260569 A1 | 10/2013 | Gangster et al. | |

FOREIGN PATENT DOCUMENTS

| | | |
|---|---|---|
| KR | 10-2005-0068666 A | 7/2005 |
| KR | 10-2007-0052609 A | 5/2007 |
| KR | 10-2009-0034538 A | 4/2009 |
| KR | 10-2009-0132044 A | 12/2009 |
| KR | 10-2010-0026388 A | 3/2010 |
| KR | 10-2010-0082550 A | 7/2010 |
| KR | 10-2010-00136835 A | 12/2010 |
| KR | 10-2011-0003663 A | 1/2011 |

* cited by examiner a
APPARATUS AND A METHOD FOR TREATING A SUBSTRATE

CROSS-REFERENCE TO RELATED APPLICATION

This U.S. non-provisional patent application is a divisional of U.S. application Ser. No. 13/755,533, filed Jan. 31, 2013, which claims priority under 35 U.S.C. §119 to Korean Patent Application No. 10-2012-0011354, filed on Feb. 3, 2012, in the Korean Intellectual Property Office, the disclosures of which are incorporated by reference herein in their entireties.

TECHNICAL FIELD

The inventive concept relates to a substrate treating apparatus and a substrate treating method.

DISCUSSION OF THE RELATED ART

While a semiconductor device is produced, unwanted materials, such as particles, organic pollutants, or metallic contaminants, may be left on a substrate of the semiconductor device. A cleaning process may be performed to remove these materials from the substrate.

An example of one such cleaning process is an abrasive cleaning. In the abrasive cleaning, a polishing tool (e.g., a polishing brush, a polishing belt, and a polishing pad) may be used to mechanically polish the surface of the substrate by using chemical-mechanical polishing (CMP) slurry provided on the substrate.

SUMMARY

An exemplary embodiment of the inventive concept provides a substrate treating method that may include jetting a fluid containing an abrasive onto a substrate, and polishing the substrate using the jetted fluid.

An exemplary embodiment of the inventive concept provides a substrate treating apparatus that may include a supporting unit supporting a substrate, a nozzle unit configured to jet a fluid containing an abrasive onto the substrate, and a supplying unit supplying the fluid to the nozzle unit.

An exemplary embodiment of the inventive concept provides a substrate treating apparatus that may include a process module configured to jet a fluid containing an abrasive through a nozzle to a substrate and an index module configured to transfer the substrate from an outside source to the process module, wherein the nozzle is positioned over a top surface of the substrate to be oriented toward the top surface of the substrate or is positioned adjacent to a side of the substrate so that an axis of the nozzle is substantially parallel to the top surface of the substrate.

BRIEF DESCRIPTION OF THE DRAWINGS

Exemplary embodiments will be more clearly understood from the following brief description taken in conjunction with the accompanying drawings.

FIG. 1 is a plan view illustrating a substrate treating apparatus according to an exemplary embodiment of the inventive concept.

FIG. 2 is a sectional view illustrating a process chamber of FIG. 1, according to an exemplary embodiment of the inventive concept.

FIG. 3 is a plan view illustrating the process chamber of FIG. 2, according to an exemplary embodiment of the inventive concept.

FIG. 4 is a side view illustrating the nozzle unit of FIG. 2, according to an exemplary embodiment of the inventive concept.

FIG. 5 is a sectional view illustrating the nozzle unit of FIG. 2, according to an exemplary embodiment of the inventive concept.

FIG. 6 is a plan view illustrating the process chamber of FIG. 2, according to an exemplary embodiment of the inventive concept.

FIG. 7 is a schematic diagram illustrating the supplying unit of FIG. 2, according to an exemplary embodiment of the inventive concept.

FIG. 8 is a schematic diagram illustrating the supplying unit of FIG. 3, according to an exemplary embodiment of the inventive concept.

FIG. 9 is a flow chart illustrating a substrate treating method according to an exemplary embodiment of the inventive concept.

FIG. 10 is a flow chart illustrating a jet polishing process according to an exemplary embodiment of the inventive concept.

FIG. 11 is a diagram illustrating a process of removing a deposition layer from a substrate, according to an exemplary embodiment of the inventive concept.

FIG. 12 is a diagram exemplarily illustrating a thickness of the deposition layer according to the presence or absence of chemical, according to an exemplary embodiment of the inventive concept.

FIG. 13 is a diagram illustrating an additive that can be used to protect a surface of a substrate or a layer on the substrate, according to an exemplary embodiment of the inventive concept.

FIG. 14 is a graph showing a correlation between a jetting pressure and a polishing thickness of a substrate, according to an exemplary embodiment of the inventive concept.

DETAILED DESCRIPTION OF THE EMBODIMENTS

Figure 1:
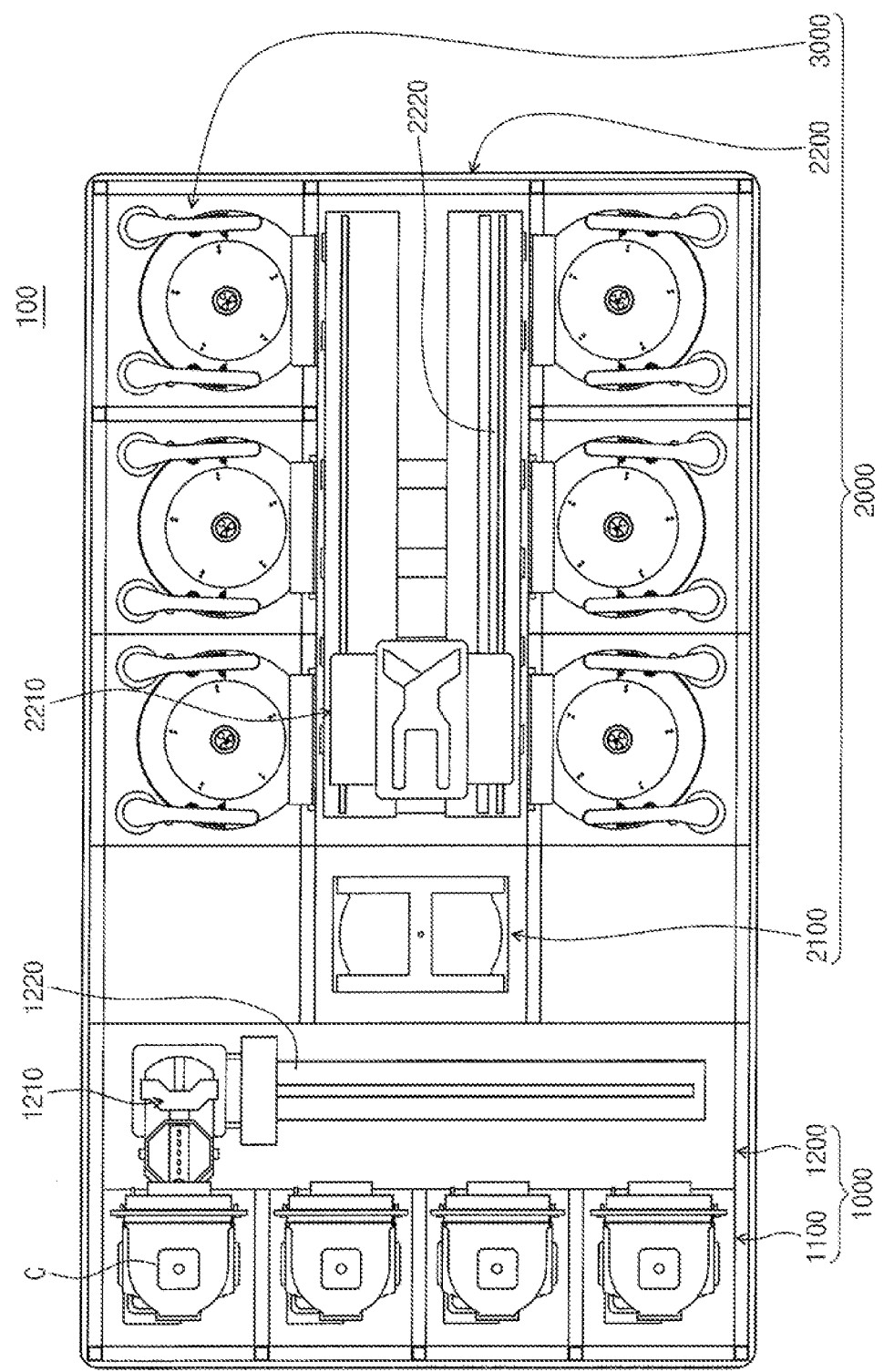
FIGS. 1 through 14 represent non-limiting, exemplary embodiments as described herein.

Exemplary embodiments of the inventive concept will now be described in detail with reference to the accompanying drawings. The inventive concepts may, however, be embodied in many different forms and should not be construed as being limited to the embodiments set forth herein. In the drawings, the thicknesses of layers and regions may be exaggerated for clarity. Like reference numerals in the drawings may denote like or similar elements throughout the specification and the drawings.

It will be understood that when an element is referred to as being "connected" or "coupled" to another element, it can be directly connected or coupled to the other element or intervening elements may be present. As used herein the term "and/or" includes any and all combinations of one or more of the associated listed items.

As used herein, the singular forms "a," "an" and "the" are intended to include the plural forms as well, unless the context clearly indicates otherwise.

Hereinafter, a substrate treating apparatus 100 according to an exemplary embodiment of the inventive concept will be described.

The substrate treating apparatus 100 may perform a jet polishing process. For example, according to an embodiment, in the substrate treating apparatus 100, a fluid may be jetted onto a substrate S and polishes the substrate S. According to an embodiment, the substrate S includes a substrate, which can be used to form a semiconductor device, a flat panel display, or a device with thin-film circuit patterns. For example, according to an embodiment, the substrate S may be one of semiconductor wafers (e.g., a silicon wafer), glass substrates, or organic substrates.

According to an embodiment, the jet polishing process includes a process of jetting an abrasive-containing fluid (e.g., chemical-mechanical polishing slurry) on the substrate S. The jet polishing process may remove an alien substance from the substrate S or may make a surface of the substrate S flat.

In an embodiment, the substrate treating apparatus 100 may be used to perform a jet polishing process on a semiconductor wafer, but the exemplary embodiments of the inventive concept are limited thereto. For example, according to an embodiment, the substrate treating apparatus 100 may be used to perform the jet polishing on a substrate other than the semiconductor wafer.

FIG. 1 is a plan view illustrating a substrate treating apparatus according to an exemplary embodiment of the inventive concept.

Referring to FIG. 1, the substrate treating apparatus 100 may include an index module 1000 and a process module 2000.

The index module 1000 may transport a substrate S from the outside to the process module 2000, and the process module 2000 may perform a jet polishing process.

The index module 1000 may constitute an equipment front end module (EFEM) and include a load port 1100 and a transferring frame 1200.

A carrier C containing the substrate S may be provided in the load port 1100. In an exemplary embodiment, the carrier C may be a front opening unified pod (FOUP). The carrier C may be delivered from the outside to the load port 1100 or from the load port 1100 to the outside by an overhead transfer (OHT).

The transferring frame 1200 may enable the substrate S to be transferred between the carrier C and the process module 2000. The transferring frame 1200 may include an index robot 1210 and an index rail 1220. The index robot 1210 may be moved on the index rail 1220, and the substrate S may be delivered by the index robot 1210.

In an exemplary embodiment, the process module 2000 may include a buffer chamber 2100, a transfer chamber 2200, and a process chamber 3000.

The buffer chamber 2100 may provide a space in which the substrate S can be temporarily stored before the substrate S is delivered between the index module 1000 and the process module 2000. The buffer chamber 2100 may include a buffer slot on which the substrate S may be disposed. Using the index robot 1210, the substrate S may be brought out from the carrier C and loaded on the buffer slot, and using a transferring robot 2210 the substrate S may be delivered from the buffer slot to the process chamber 3000. The buffer chamber 2100 may include a plurality of buffer slots arranged along a vertical direction, and a plurality of the substrates S may be stacked in the buffer chamber 2100.

The transfer chamber 2200 may be configured in such a way that the substrate S can be delivered between the buffer chamber 2100 adjacent to the transfer chamber 2200 and the process chamber 3000. The transfer chamber 2200 may include the transferring robot 2210 and a transferring rail 2220. The transferring robot 2210 may be moved on the transferring rail 2220 and delivers the substrate S to a predetermined position.

The process chamber 3000 may be disposed around the transfer chamber 2200. The process chamber 3000 may process the substrate S, which may be delivered from the transfer chamber 2200.

In an exemplary embodiment, a plurality of the process chambers 3000 may be provided in the process module 2000. According to embodiments, the process chambers 3000 may be arranged at one or two opposite sides of the transfer chamber 2200 along a longitudinal direction of the transfer chamber 2200. Alternatively, the process chambers 3000 may be stacked in the vertical direction. The exemplary embodiments of the inventive concept are not limited thereto, and an internal structure or configuration of the process chamber 3000 may be modified in consideration of various factors, such as foot print or process efficiency of the substrate treating apparatus 100.

In an exemplary embodiment, the process chamber 3000 may perform a jet polishing process.

Hereinafter, the process chamber 3000 is described with reference to FIGS. 2 and 3 according to an exemplary embodiment of the inventive concept.

Figure 2:
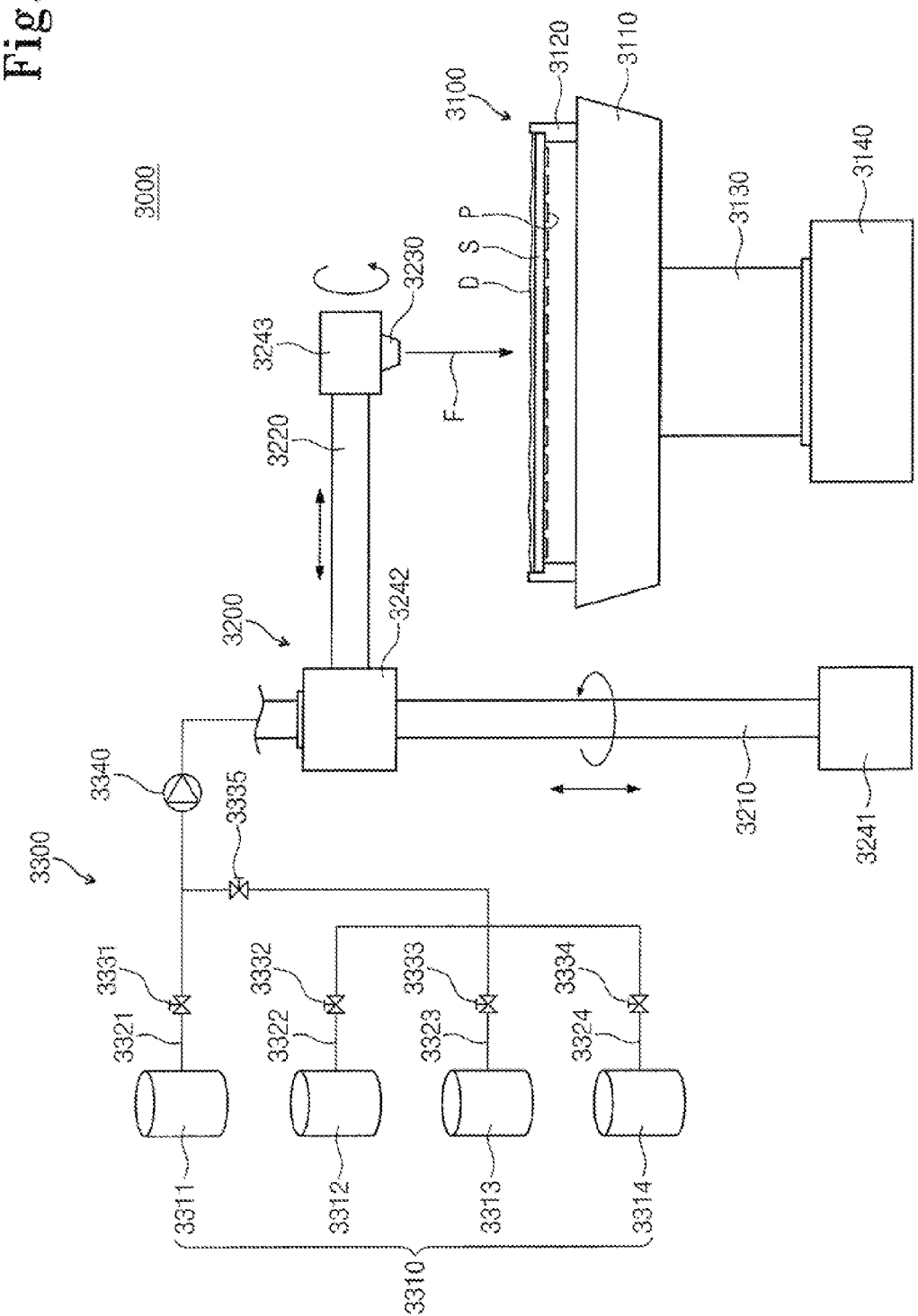
Figure 3:
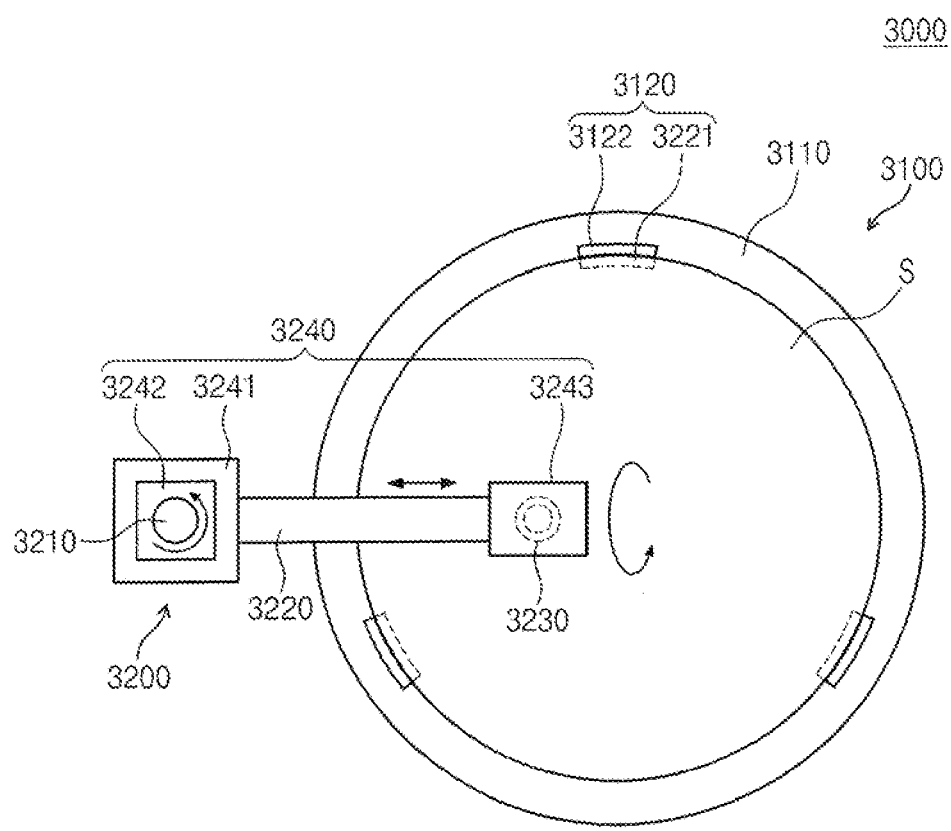

FIG. 2 is a sectional view illustrating the process chamber 3000 of FIG. 1 according to an exemplary embodiment of the inventive concept, and FIG. 3 is a plan view illustrating the process chamber 3000 of FIG. 2 according to an exemplary embodiment of the inventive concept.

Referring to FIGS. 2 and 3, the process chamber 3000 may include a supporting unit 3100, a nozzle unit 3200, and a supplying unit 3300.

The supporting unit 3100 may support the substrate S. The supporting unit 3100 may include a supporting plate 3110, a supporting member 3120, a rotating axis 3130, and a rotation driver 3140.

From a plan view, the supporting plate 3110 may have a shape similar to the shape of the substrate S. For example, according to an embodiment, in the case where the substrate S is a semiconductor wafer, the supporting plate 3110 may have a circular top surface.

The supporting member 3120 may be provided on the top surface of the supporting plate 3110. The supporting member 3120 may be located at an edge region of the supporting plate 3110. The supporting member 3120 may include a plurality of parts, each of which may be located at a position spaced apart from a center of the supporting plate 3110 by a radius of the substrate S.

The supporting member 3120 may protrude from a top surface of the substrate S. The supporting member 3120 may support the substrate S. The supporting member 3120 may immobilize the substrate S. In an exemplary embodiment, the supporting member 3120 may be shaped like a letter 'L' or 'U', from a side view. For example, according to an embodiment, in the case where the supporting member 3120 is shaped like the letter 'L', the supporting member 3120 may include an outer portion 3122 and an inner portion 3121 having a height smaller than a height of the outer portion 3122. The substrate S may be supported by the inner portion 3121 and may be immobilized by the outer portion 3122. Due to the presence of the supporting member 3120, the substrate S may be prevented from being deviated from a normal position thereof when the substrate S is rotated.

A bottom surface of the supporting plate 3110 may be connected to the rotating axis 3130, and the rotating axis 3130 may be connected to the rotation driver 3140. Accordingly, a turning force of the rotation driver 3140 may be delivered to the supporting plate 3110 via the rotating axis 3130, and the substrate S may be rotated in conjunction with the supporting plate 3110.

The nozzle unit 3200 may jet a fluid onto the top surface of the substrate S. The fluid may be focused on a specific position of the substrate S since the fluid is jetted by the nozzle unit 3200.

The nozzle unit 3200 may include a nozzle bar 3210, a nozzle rod 3220, a nozzle 3230, and a nozzle driver 3240. The nozzle bar 3210 may be disposed at a side of the supporting plate 3110. The nozzle bar 3210 may have a vertically extended bar shape. The nozzle rod 3220 may be joined to an upper portion of the nozzle bar 3210. The nozzle rod 3220 may be shaped like a rod, which may horizontally extend from the upper portion of the nozzle bar 3210. The nozzle 3230 may be provided on a bottom surface of an end portion of the nozzle rod 3220. The nozzle 3230 may include an ejecting port provided on a bottom surface thereof and the ejecting port is used to jet a fluid.

The nozzle driver 3240 may be provided below the nozzle bar 3210 at a joining region between the nozzle bar 3210 and the nozzle rod 3220, and at a joining region between the nozzle rod 3220 and the nozzle 3230. The nozzle driver 3240 may move or rotate the nozzle bar 3210, the nozzle rod 3220, or the nozzle 3230 and may adjust a position of the nozzle 3230 and a jetting angle of the fluid.

Figure 4:
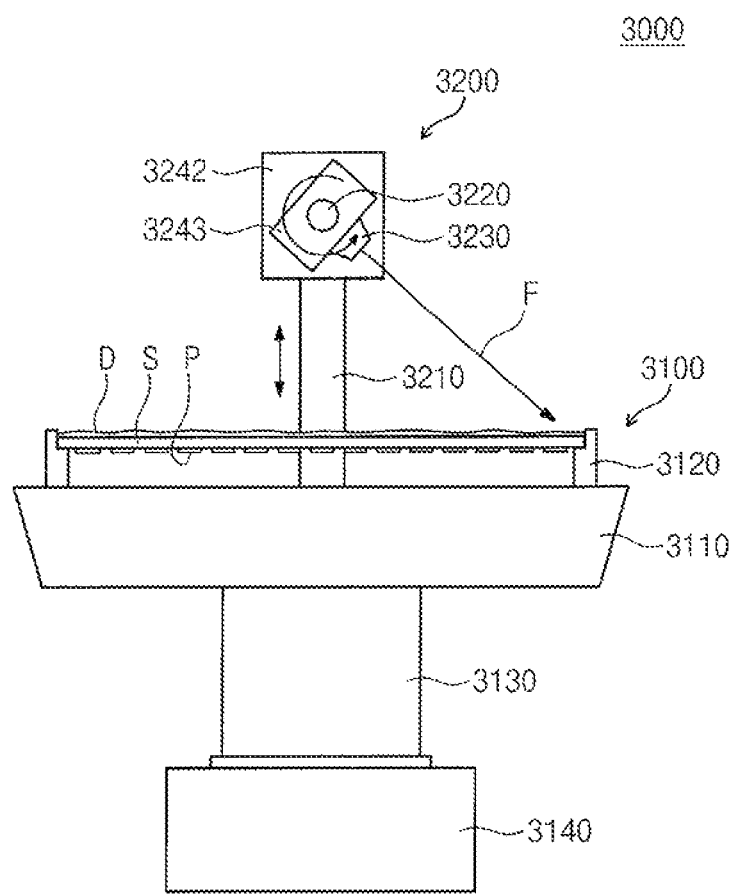

FIG. 4 is a side view illustrating the nozzle unit 3200 of FIG. 2, according to an exemplary embodiment of the inventive concept.

The nozzle driver 3240 may include, for example, a first nozzle driver 3241 disposed below the nozzle bar 3210, a second nozzle driver 3242 disposed at the joining region between the nozzle bar 3210 and the nozzle rod 3220, and a third nozzle driver 3243 disposed at the joining region between the nozzle rod 3220 and the nozzle 3230, as shown in FIGS. 2 through 4. In an exemplary embodiment, the first nozzle driver 3241 may vertically move the nozzle bar 3210 or rotate the nozzle bar 3210 around its own axis. The second nozzle driver 3242 may horizontally move the nozzle rod 3220 and may adjust a length of the nozzle rod 3220. The third nozzle driver 3243 may rotate the nozzle 3230 around an axis of the nozzle rod 3220 and may adjust a jetting angle of fluid.

The configuration of the nozzle driver 3240 may not be limited to the above-described example, and according to an embodiment, the number, structure, disposition, and function of the nozzle driver 3240 may be variously changed as the need arises. For example, according to an embodiment, at least one of the first nozzle driver 3241, the second nozzle driver 3242 and the third nozzle driver 3243 may be omitted. Alternatively, the third nozzle driver 3243 may be provided at the same or substantially the same position as the second nozzle driver 3242, and the nozzle bar 3210, not the nozzle 3230, may be rotated to adjust the jetting angle of fluid. In addition, the nozzle unit 3200 may have a fixed nozzle configured to spray a fluid in a vertical direction without using the nozzle driver 3240.

According to the above-described example, the nozzle unit 3200 may jet the fluid onto the top surface of the substrate S, but the exemplary embodiments of the inventive concept are not limited thereto. For example, according to an embodiment, the nozzle unit 3200 may jet the fluid toward a side of the substrate S.

Figure 5:
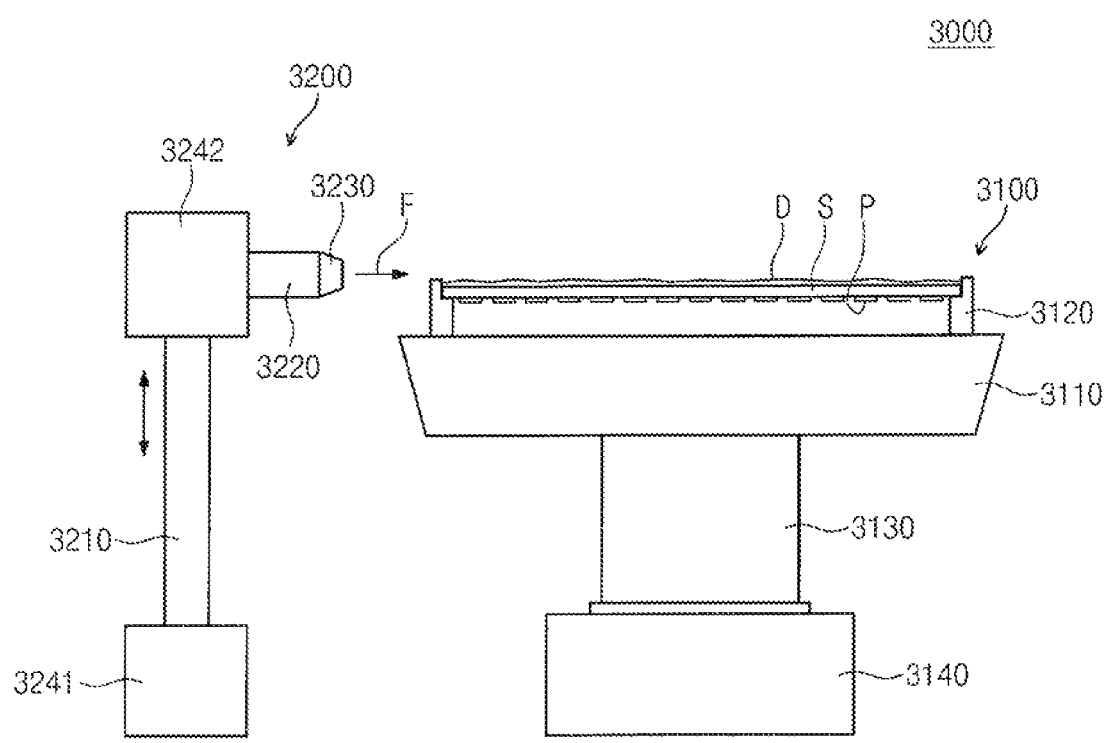

FIG. 5 is a sectional view illustrating the nozzle unit 3200 of FIG. 2, according to an exemplary embodiment of the inventive concept.

Referring to FIG. 5, the nozzle 3230 of the nozzle unit 3200 may be provided at an end portion of the nozzle rod 3220 extending from the nozzle bar 3210. The nozzle 3230 may have an ejecting port with an axis parallel or substantially parallel to the horizontal direction. Accordingly, the nozzle 3230 may jet the fluid in the horizontal direction. The first nozzle driver 3241 may vertically move or rotate the nozzle bar 3210.

According to the above-described example, a single nozzle unit 3200 may be provided in the process chamber 3000, but in an embodiment, the process chamber 3000 may include a plurality of nozzle units 3200.

Figure 6:
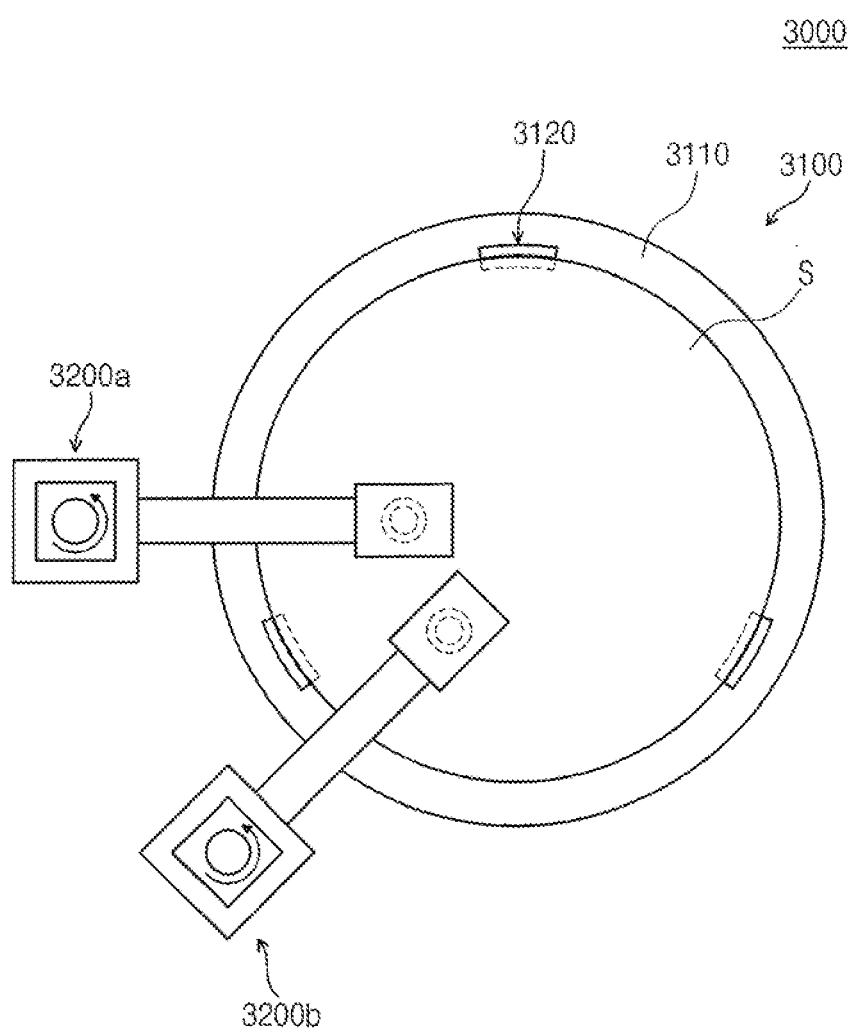

FIG. 6 is a plan view illustrating the process chamber 3000 of FIG. 2, according to an exemplary embodiment of the inventive concept.

The process chamber 3000 may include a plurality of nozzle units 3200. For example, as shown in FIG. 6, the process chamber 3000 may include a first the nozzle unit 3200a and a second the nozzle unit 3200b. The nozzle units 3200 may jet the same fluid or different fluids from each other. The nozzle units 3200 may perform the jetting process simultaneously or independently.

The supplying unit 3300 may provide a fluid to the nozzle unit 3200. The fluid may include at least one of solvents, abrasives, chemicals, and additives.

A polishing target may be polished through a collision with an abrasive. By using a chemical, the polishing target may be softened and may be more easily polished by the abrasive. An additive may be attached on a non-target layer other than the polishing target, thereby preventing the non-target layer from being polished by the abrasive.

In an exemplary embodiment, deionized water may be used as a solvent. According to an embodiment, the abrasive may include one of various particles (e.g., of silica ($SiO_2$), alumina ($Al_2O_3$), ceria ($CeO_2$), and magnesia (MgO)) and a solution including the particles.

According to an embodiment, the chemical may be at least one solution of, for example, KOH, HF, $H_2O_2$, $NH_4OH$, HCl, $H_2SO_4$, and any combination thereof, but exemplary embodiments of the inventive concept are not limited thereto.

The additive may be at least one polymeric material, such as polyacrylic acid (PAA) or polyethyleneimine (PIE), but exemplary embodiments of the inventive concept are not limited thereto. For example, various materials may be used as the additive depending on the material of the non-target layer.

The supplying unit 3300 may include a storage 3310 for storing the fluid, a supplying conduit 3320 for connecting the storage 3310 with the nozzle unit 3200, a valve 3330 for controlling a flow rate of a fluid flowing through the supplying conduit 3320, and a pump 3340 for pressurizing the fluid supplied in the supplying conduit 3320.

In an exemplary embodiment, the supplying unit 3300 may include a plurality of storages 3310. The storages 3310 may store different materials from each other.

Figure 7:
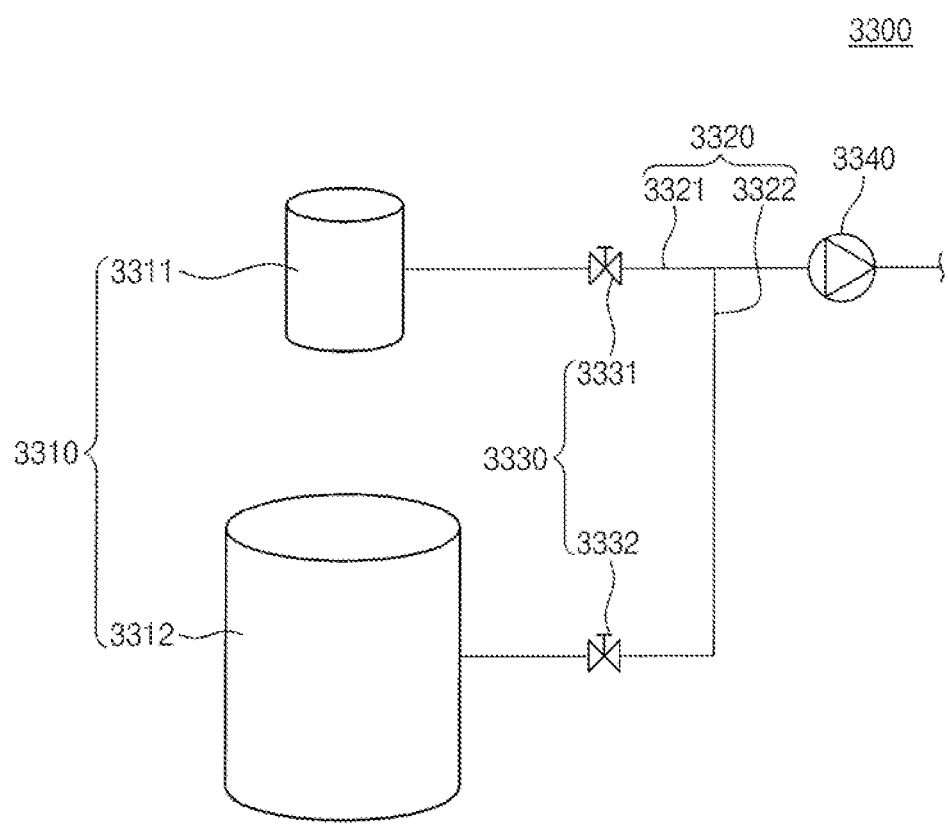

FIG. 7 is a schematic diagram illustrating the supplying unit of FIG. 2, according to an exemplary embodiment of the inventive concept.

Referring to FIG. 7, the supplying unit 3300 may include a first storage 3311, a first supplying conduit 3321, a first valve 3331, a second storage 3312, a second supplying conduit 3322, a second valve 3332, and the pump 3340.

The first storage 3311 may store a first fluid. In an exemplary embodiment, the first fluid may be a solvent. The first supplying conduit 3321 may connect the first storage 3311 with the nozzle unit 3200. The first valve 3331 and the pump 3340 may be provided on the first supplying conduit 3321.

The second storage 3312 may store a second fluid. In an exemplary embodiment, the second fluid may include at least one of chemicals, abrasives, and additives. The second supplying conduit 3322 may connect the second storage 3312 with the nozzle unit 3200. According to an embodiment, the second supplying conduit 3322 may have a structure diverging from the first supplying conduit 3321. The second valve 3332 may be provided on the second supplying conduit 3322.

According to the above-described structure, the supplying unit 3300 may supply a fluid, in which the first fluid and the second fluid are mixed with each other, to the nozzle unit 3200. The first valve 3330 and the second valve 3332 may control flow rates of fluids flowing through the first and second supplying conduits 3321 and 3322, and the fluid may thus have a predetermined chemical composition.

According to the above-described example, the second fluid may include at least one of chemicals, abrasives, and additives, but the exemplary embodiments of the inventive concept are not limited thereto.

Figure 8:
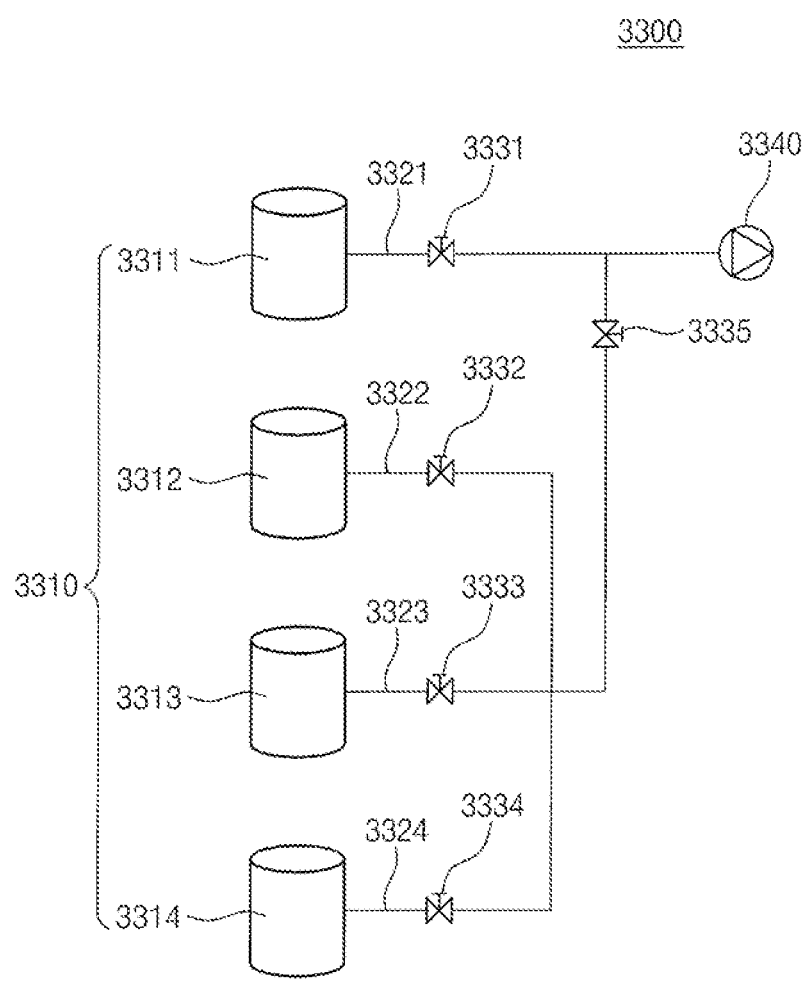

FIG. 8 is a schematic diagram illustrating the supplying unit 3300 of FIG. 3, according to an exemplary embodiment of the inventive concept.

Referring to FIG. 8, the supplying unit 3300 may include the first storage 3311, the first supplying conduit 3321, the first valve 3331, the second storage 3312, the second supplying conduit 3322, the second valve 3332, a third storage 3313, a third supplying conduit 3323, a third valve 3333, a fourth storage 3314, a fourth supplying conduit 3324, a fourth valve 3334, a fifth valve 3335, and the pump 3340.

In an embodiment, the first storage 3311 may store a solvent, the second storage 3312 may store a chemical, the third storage 3313 may store an abrasive, and the fourth storage 3314 may store an additive. Each of the supplying conduits 3321, 3322, 3323, and 3324 may connect the nozzle unit 3200 with the storages 3311, 3312, 3313, and 3314, respectively. In an exemplary embodiment, the second, third, and fourth supplying conduits 3322, 3323, and 3324 may be merged with each other before being connected to the first supplying conduit 3331.

Flow rates of fluids flowing through the supplying conduits 3321, 3322, 3323 and 3324 may be independently controlled by the valves 3331, 3332, 3333, 3334, and 3335, and thus, the fluid with a predetermined content ratio of the solvent, the chemical, the abrasive, and the additive may be supplied to the pump 3340. The first to fourth valves 3331-3334 may control flow rates of fluids flowing through the first to fourth supplying conduits 3321-3324, respectively, and the fifth valve 3335 may control a flow rate of a fluid flowing through a merged conduit of the second, third, and fourth supplying conduits 3322, 3333, and 3334.

The process chambers 3000 which are used for a jet polishing process have been described, but at least one of the process chambers 3000 may be used to perform a different process from the jet polishing process. In this case, the substrate S may be transferred between the process chambers 3000 by the transfer chamber 2200, such that the jet polishing process can be successively performed before and after the different process.

In an exemplary embodiment, at least one of the process chambers 3000 may perform a dry or wet cleaning process. The substrate S may undergo the jet polishing process in one of the process chambers, and then undergo the dry or wet cleaning process in another of the process chambers. Alternatively, the substrate S may be treated by the jet polishing process before undergoing the dry or wet cleaning process.

In an exemplary embodiment, at least one of the process chambers 3000 may be used to perform etching, strip, ashing or other processes which may result in contaminants remaining on the substrate S. In this case, the substrate S may undergo a contamination causing process in one of the process chambers, and undergo the jet polishing process in another of the process chambers.

According to an embodiment, the substrate treating apparatus 100 may further include a controller.

The controller may control the above-described components of the substrate treating apparatus 100. For example, according to an embodiment, the controller may control an operation of the index robot 1210 or the transferring robot 2210. In an exemplary embodiment, the controller may control an open/close operation of a door of each chamber. In an exemplary embodiment, the controller may control the rotation driver 3140 and the nozzle driver 3240 to control an operation of the supporting unit 3100 or the nozzle unit 3200. In an embodiment, the controller may control the valve 3330 or the pump 3340 and may adjust a flow rate or a fluid pressure of a fluid flowing through the supplying conduit 3320.

The controller may be realized in hardware or software or using a combination thereof.

When realized in hardware, the controller may be an electronic device, such as application specific integrated circuits (ASICs), digital signal processors (DSPs), digital signal processing devices (DSPDs), programmable logic devices (PLDs), field programmable gate arrays (FPGAs), processors, micro-controllers, microprocessors, and so forth.

When realized in software, the controller may be realized by software codes or software applications written in at least one programming language. The software may be executed by a controller realized in hardware. In addition, the software may be transmitted from an external device, e.g., a server, and installed on a hardware device.

A substrate treating method according to an exemplary embodiment of the inventive concept will be described below with reference to FIGS. 9 and 10. In an exemplary embodiment, the substrate treating method may be performed using the substrate treating apparatus 100 described above, but the exemplary embodiments of the inventive concept are not limited thereto. In addition, the substrate treating method may be stored in the form of codes or a computer program in a recording medium that can be read by a computer.

Figure 9:
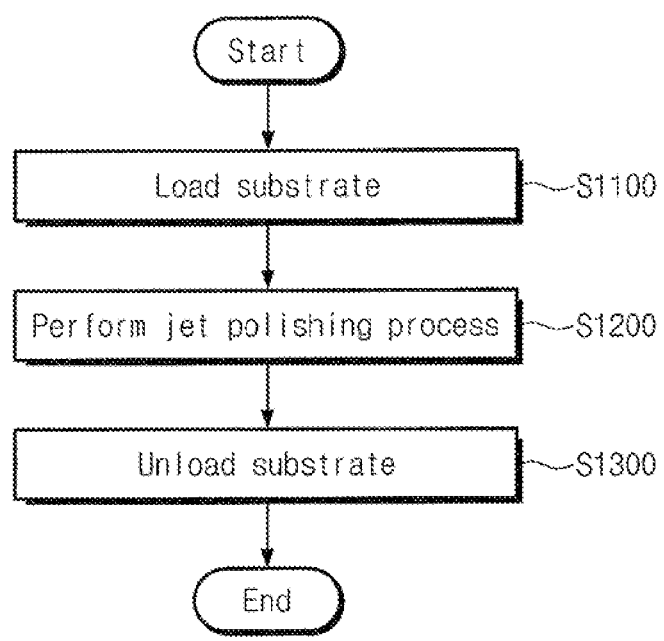
Figure 10:
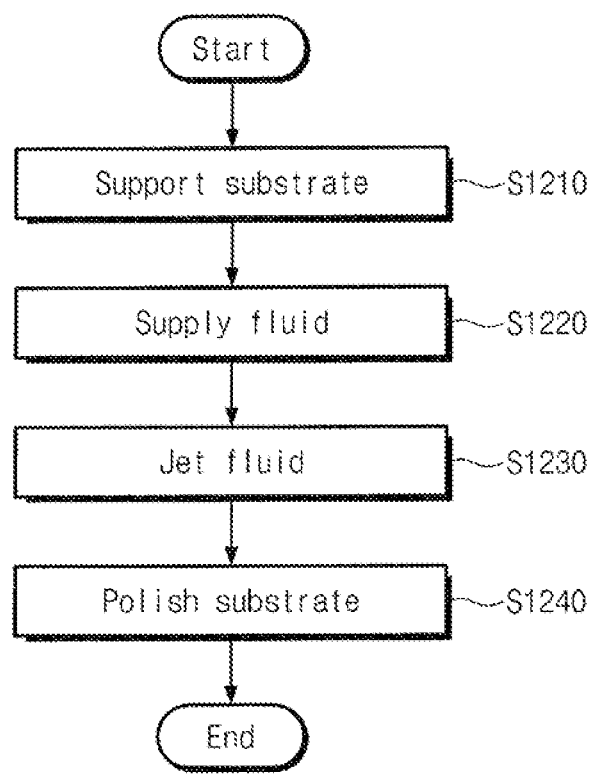

FIG. 9 is a flow chart illustrating a substrate treating method according to an exemplary embodiment of the inventive concept, and FIG. 10 is a flow chart illustrating a jet polishing process according to an exemplary embodiment of the inventive concept.

Referring to FIG. 9, the substrate treating method may include loading the substrate S in the process chamber 3000 (in S1100), performing a jet polishing process (in S1200), and unloading the substrate S from the process chamber 3000 (in S1300). In an exemplary embodiment, the jet polishing process (in S1200) may include supporting the substrate S (in S1210), supplying a fluid onto the nozzle unit 3200 (in S1220), jetting the fluid onto the substrate S (in S1230), and performing a jet polishing process on the substrate S (in S1240).

The substrate S may be loaded into the process chamber 3000 (in S1100). The carrier C with the substrate S may be loaded on the load port 1100 by using a delivering apparatus, such as an overhead transfer apparatus. Using the index robot 1210, the substrate S may be unloaded from the carrier C and be delivered to a buffer slot. The transferring robot 2210 may unload the substrate S from the buffer chamber 2100 and load the substrate S into the process chamber 3000. In an embodiment, before loading the substrate S into the process chamber 3000, the substrate S may be loaded in other process chambers and undergo a process other than the jet polishing process.

The jet polishing process may be performed on the substrate S loaded in the process chamber 3000 (in S1200).

As shown in FIG. 10, the substrate S may be laid on the supporting plate 3110 of the process chamber 3000. The substrate S may be supported by the supporting member 3120 (in S1210). For example, according to an embodiment, an edge portion of the substrate S may be supported by the supporting member 3120. In an exemplary embodiment, the substrate S may be laid in such a way that a bottom surface thereof is a patterned surface and a top surface thereof is a non-patterned surface. The substrate S may be fixed at a predetermined position by the supporting member 3120.

The supplying unit 3300 may supply a fluid into the nozzle unit 3200 (in S1220). The fluid may be supplied from the storage 3310 to the nozzle unit 3200 through the supplying conduit 3320.

When the supplying unit 3300 has a plurality of storages 3310 and a plurality of supplying conduits 3320, the valves 3330 may be provided on the supplying conduits 3320, respectively, and may control a flow rate of a fluid flowing through the supplying conduit 3320 and may adjust the composition or content of the resulting fluid. Since a polishing rate of the substrate S is proportional or substantially proportional to the content of abrasive in the fluid, the polishing process can be rapidly or slowly performed by increasing or decreasing a flow rate of abrasive. For example, according to an embodiment, the supplying unit 3300 may control flow rates of the supplying conduits 3320 or the content of chemical or additive in the fluid to improve process efficiency.

The pump 3340 provided on the supplying conduit 3320 may control a fluid pressure of the fluid, and the fluid pressure may determine a jetting pressure of the fluid to be jetted from the nozzle 3230.

The nozzle unit 3200 may jet the fluid onto the top surface of the substrate S (in S1230).

The nozzle driver 3240 may move and rotate the nozzle bar 3210 and the nozzle rod 3220, and thus, the nozzle 3230 may be moved on a predetermined position of the substrate S. The nozzle 3230 may be rotated by the nozzle driver 3240 and may control a predetermined jetting angle of the fluid. In the jetting of the fluid (in S1230), a jetting pressure of the fluid may be controlled by, for example, the pump 3340.

When the nozzle 3230 is positioned at a predetermined position, the fluid may be jetted from the nozzle 3230. Using the jetting technique, the fluid may be locally and intensively jetted on a specific position of the substrate S. In an exemplary embodiment, the substrate S may be rotated by the supporting unit 3100.

The substrate S may be polished by a jet of the fluid (in S1240).

For example, according to an embodiment, the polishing may include removing contaminants with the abrasive contained in the fluid. According to an embodiment, a portion of the deposition layer deposited on the non-patterned surface of the substrate S may include contaminants (e.g., particles that deteriorate the performance of the semiconductor device).

Figure 11:
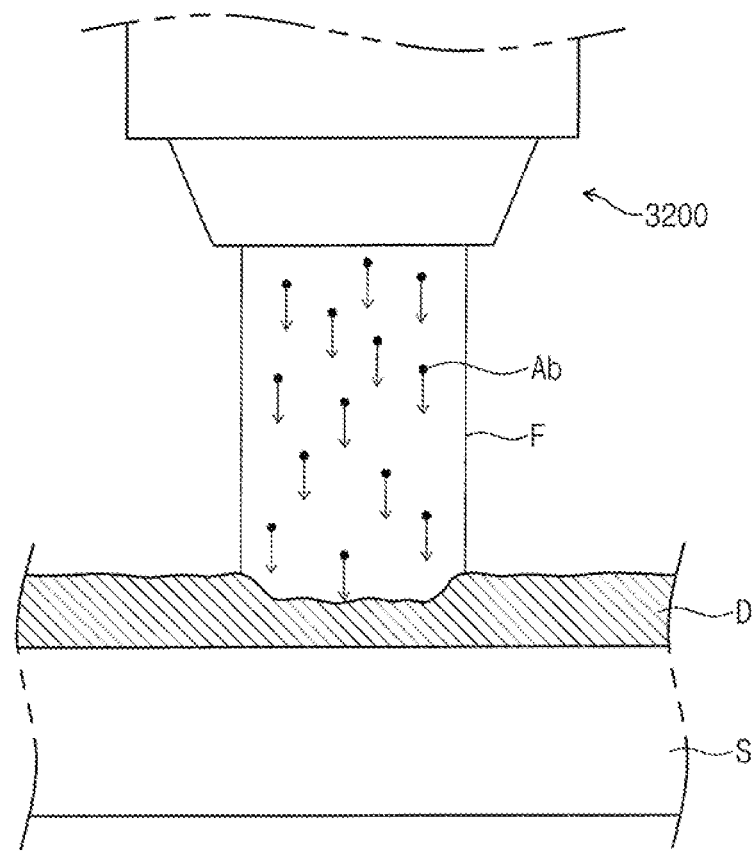

FIG. 11 is a diagram illustrating a process of removing a deposition layer from the substrate A, according to an exemplary embodiment of the inventive concept. Referring to FIG. 11, an abrasive Ab in the fluid F may collide with the deposition layer D on the substrate S at high speed, thereby polishing and removing a deposition layer D from the substrate S.

Since the fluid is jetted by the nozzle unit 3200, the fluid may be locally and intensively jetted on a specific region of the substrate S. Accordingly, a specific region of the substrate S (for example, a region provided with the contaminants) may be selectively polished.

The bevel region may be easily polished due to the localized jetting of the fluid. When a mechanical polishing tool (e.g., polishing pad) is used, the bevel region might not be effectively polished owing to a sloped profile of the bevel region. However, in the substrate treating apparatus 1000, the jet polishing process can be performed on the bevel region since a fluid jet is used to polish the bevel region.

The chemical may soften the contaminants or the polishing target. By using the chemical, the contaminants or the polishing target may be softened and may be more easily polished by the abrasive.

Figure 12:
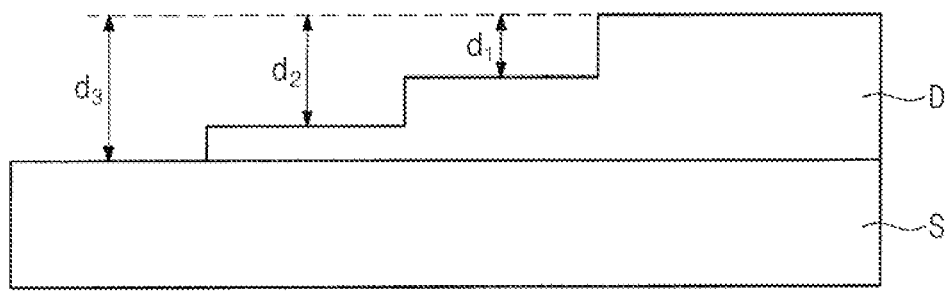

FIG. 12 is a diagram illustrating a thickness of the deposition layer D according to the presence or absence of chemical, according to an exemplary embodiment of the inventive concept. Referring to FIG. 12, a first polishing thickness d1 is a thickness of the deposition layer D polished using a conventional polishing process. A second polishing thickness d2 is a thickness of the deposition layer D polished using the jet polishing process, in which the chemical is not used according to an exemplary embodiment of the inventive concept. A third polishing thickness d3 is a thickness of the deposition layer D polished using the jet polishing process, in which the chemical is used to soften the polishing target according to an exemplary embodiment of the inventive concept.

The additive may protect a surface of the substrate or a non-target layer.

Figure 13:
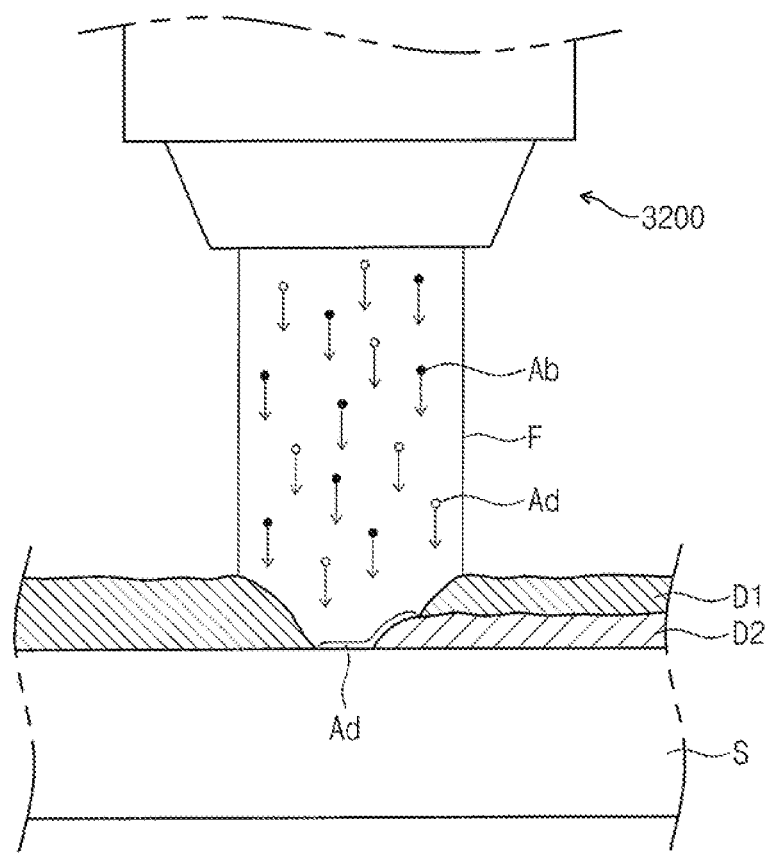

FIG. 13 is a diagram illustrating an additive that can be used to protect a surface of a substrate S or a layer on the substrate S. Referring to FIG. 13, the additive Ad may be attached on the surface of the substrate S or a second layer D2 provided on the substrate S. The additive Ad may be formed of a material having polishing resistance to the abrasive Ab. Accordingly, the surface of the substrate S or the second layer D2 may be prevented from being polished by the abrasive Ab contained in the fluid jet. A first layer D1, which is not covered with the additive Ad, may be selectively polished by the fluid jet.

Figure 14:
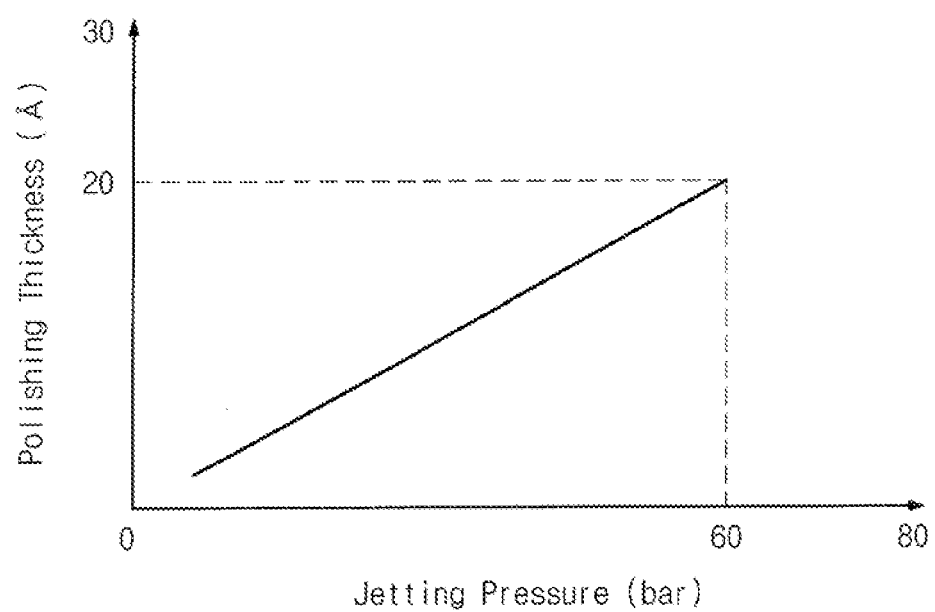

FIG. 14 is a graph showing a correlation between a jetting pressure and a polishing thickness of the substrate S, according to an exemplary embodiment of the inventive concept.

Referring to FIG. 14, a polishing rate may be proportional or substantially proportional to the jetting pressure. Accordingly, the polishing process can be rapidly or slowly performed by increasing or decreasing the jetting pressure, which may be controlled by the pump 3340.

The jet polishing process described above with reference to FIGS. 1 through 14 may be used for a planarization process that makes a top surface of the substrate or a layer on the substrate flat. For example, according to an embodiment, the planarization process using the jet polishing process may include providing or colliding the abrasive to the non-patterned surface and the patterned surface of the substrate S.

Hereinafter, a planarization process performed on the bevel region of the substrate S is described according to an exemplary embodiment of the inventive concept.

The nozzle driver 3240 may move or rotate the nozzle bar 3210 and the nozzle rod 3220 in such a way that the nozzle 3230 is positioned on a portion of the bevel region of the substrate S. Alternatively, the nozzle driver 3240 may adjust the jetting angle of the nozzle 3230 in such a way that the fluid from the nozzle 3230 is jetted on a portion of the bevel region of the substrate S. In an exemplary embodiment, during the fluid jetting process, the substrate S may be rotated by the rotation driver 3140, and thus, the fluid can be jetted to the whole bevel region of the substrate S.

During the fluid jetting process, the bevel region of the substrate S may be polished by the abrasive contained in the fluid, thus resulting in the surface of the substrate S being flat.

According to an embodiment, the planarization process on the bevel region may be performed on the patterned and non-patterned surfaces of the substrate S.

When the jet polishing process is terminated, the substrate S may be unloaded (in S1300 of FIG. 9). According to an embodiment, the transferring robot 2210 may move the substrate S from the process chamber 3000 to the buffer slot, and the index robot 1210 may move the substrate S from the buffer chamber 2100 to the carrier C. Alternatively, the transferring robot 2210 may move the substrate S from a first process chamber of the process chambers to a second process chamber of the process chambers. The second process chamber may perform a process other than the jet polishing process.

According to an exemplary embodiment of the inventive concept, a jet polishing process may include a step of jetting a fluid on a substrate to effectively perform an abrasive polishing process.

While the inventive concepts has been particularly shown and described with reference to exemplary embodiments thereof, it will be understood by one of ordinary skill in the art that variations in form and detail may be made therein without departing from the spirit and scope of the inventive concept as defined by the attached claims.

What is claimed is:

1. A substrate treating method, comprising:
   projecting, from a nozzle, a pressurized fluid containing an abrasive onto a substrate, the substrate comprising a first layer, the pressurized fluid softening the first layer and the abrasive removing the softened first layer thereby polishing the substrate, wherein a rate of the polishing of the substrate is proportional to a pressure of the pressurized fluid.

2. The method of claim 1, wherein the fluid is projected onto a non-patterned surface of the substrate.

3. The method of claim 1, wherein the fluid is projected onto a contamination region of the substrate.

4. The method of claim 3, wherein the fluid is projected onto a bevel region of the substrate.

5. The method of claim 1, wherein the softening of the first layer is caused by a chemical included in the projected fluid.

6. The method of claim 5, wherein the pressurized fluid further comprises an additive, wherein
   polishing the substrate further comprises attaching the additive onto a surface of the substrate or onto a second layer provided on the substrate, and wherein
   the additive prevents the surface of the substrate or the second layer from being removed by the abrasive when the first layer is removed.

7. The method of claim 1, further comprising rotating the substrate.

8. The method of claim 1, wherein the abrasive comprises silica, ceria, or alumina.

9. A substrate treating method, comprising:
   preparing a substrate comprising a first layer and a second layer;
   pressurizing a fluid including an abrasive and an additive;
   projecting the pressurized fluid onto the first layer and the second layer;
   softening the first layer with the pressurized fluid; and
   removing the first layer with the abrasive,
   wherein the additive is attached on a surface of the substrate or the second layer, the additive preventing the substrate and the second layer from being polished by the abrasive.

10. The method of claim 9, wherein the first and second layers are deposited on a bevel region of the substrate.

11. The method of claim 9, wherein the substrate is rotated while the pressurized fluid is projected onto the first and second layers.

12. The method of claim 9, wherein the abrasive comprises silica, ceria, or alumina.

13. The method of claim 9, wherein the first and second layers are disposed on a non-patterned surface of the substrate, and the pressurized fluid is projected onto the non-patterned surface of the substrate.

14. The method of claim 9, wherein the pressurized fluid further comprises a chemical, the chemical softening the first layer.

* * * * *